United States Patent [19]

Melandri

[11] Patent Number: 4,801,895
[45] Date of Patent: Jan. 31, 1989

[54] CIRCUIT FOR REGULATING A VOLTAGE CONTROLLED OSCILLATOR

[75] Inventor: Bruno Melandri, Ivrea, Italy

[73] Assignee: Ing. C. Olivetti & C., S.p.A., Ivrea, Italy

[21] Appl. No.: 141,975

[22] Filed: Jan. 11, 1988

[30] Foreign Application Priority Data

Jan. 29, 1987 [IT] Italy ................................ 67054 A/87

[51] Int. Cl.$^4$ ............................................... H03L 7/06
[52] U.S. Cl. ........................................ 331/17; 331/25; 331/44
[58] Field of Search ..................... 331/8, 16, 17, 25, 34, 331/44, 108 D, 113 R, 117 R, 117 FE, 144, 177 R, 185, 186

[56] References Cited

U.S. PATENT DOCUMENTS 4,568,888 2/1986 Kimura et al. .................... 331/16 X Primary Examiner—Eugene R. Laroche
Assistant Examiner—David Mis
Attorney, Agent, or Firm—Banner, Birch, McKie & Beckett

[57] ABSTRACT

The circuit is particularly suitable for controlling a unit for reading and writing data on a magnetic disk. The oscillator (26) is supplied to an input with a bias voltage (R27, R28) and a phase displacement voltage which is defined by a voltage adder (R25, R26, or R23, R24 connected to a resistive divider R21, R22 or R19, R20), comprising at least one resistor (R21, R22 or R19, R20) which is calibratable so as to define a preset voltage component. The adder adds to this component a control component derived by a phase comparator, current pump (19), integrator (21) and operational amplifier (22). The circuit is in the form of a hybrid integrated circuit in which the resistors are produced by means of the deposit of a thick-film resistive layer while the resistance can be calibrated by means of the removal of part of the appropriate deposited resistive layer.

12 Claims, 3 Drawing Sheets

CIRCUIT FOR REGULATING A VOLTAGE CONTROLLED OSCILLATOR

BACKGROUND OF THE INVENTION

The present invention relates to a circuit for regulating a voltage controlled oscillator, in particular for controlling a unit for reading and writing data on a magnetic carrier, in which the oscillator is supplied at its input with a bias voltage and a phase displacement voltage (offset voltage).

Since the tolerances in the various components mean that the two control voltages may generate an output frequency which is slightly different from that intended for the recording and reading of the magnetic carrier, for example a floppy disk, reading of the disk may be compromised if the disk has been recorded on a different unit from the reading unit. It is therefore necessary precisely to calibrate the multivibrator in such a way as precisely to generate the desired frequency.

In a known multivibrator the control voltage is generated by an operational amplifier while the frequency generated thereby depends on the above-mentioned voltage and the capacitance of a capacitor. The calibration operation is effected by varying the capacitance of the capacitor which must therefore be of variable type, after mounting on the board. That regulating circuit on the one hand is liable to go out of tune in the course of time while on the other hand it is of a complicated and expensive construction and does not make it possible to produce an integrated circuit which also includes the element to be calibrated.

SUMMARY OF THE INVENTION

The object of the invention is to provide a regulating circuit of the above-indicated type, which is easy and inexpensive to produce and in which final calibration is stable in respect of time.

Accordingly the regulating circuit according to the invention is characterised in that the phase displacement voltage is defined by a voltage adder, and a voltage divider comprising at least one resistor which is calibratable in such a way as to define a preset voltage component to be applied to the adder.

Such a circuit may be easily produced in the form of a hybrid integrated circuit of small dimensions such as to permit the mounting thereof on the base board of a personal computer, thus avoiding an added board for controlling the disk unit.

These and other features of the invention will be more clearly apparent from the following description of a preferred embodiment which is given by way of non-limiting example with reference to the accompanying drawings.

DESCRIPTION OF THE PREFERRED EMBODIMENT

Figure 1:
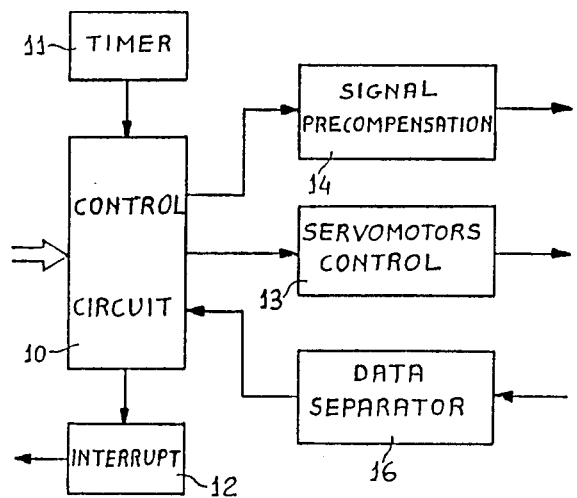
FIG. 1 is a general diagram of a control for a unit for reading and writing data on a magnetic carrier, incorporating a regulating circuit according to the invention.

The regulating circuit is described hereinafter by way of example in use for a control arrangement for a unit for reading and writing data on a flexible magnetic disk for a personal computer.

The control arrangement comprises a control circuit 10 (see FIG. 1) which is capable of interfacing the central unit of the computer with the reading and writing unit. In particular the circuit 10 may be formed by the integrated circuit uP765 which is produced for example by NEC Corporation and which is capable of controlling various rates of data transfer, for as many recording formats. For example it is possible to control the following rates of data transfer:

250 kb/sec for a disk of a capacity of about 360 formated kbytes, using a first type of reading unit (drive);

500 kb/sec for a disk of a capacity of about 1.2 formated Mbytes, using the same drive;

300 kb/sec for a disk of a capacity of about 900 formated kbytes, using a second type of drive. The first two cases will require timing with a frequency of 4 MHz while the third case will require timing with a frequency of 2.4 MHz.

The circuit is controlled by a timer 11 and can access the central unit of the computer (CPU) by means of an interrupt logic 12. The circuit 10 in turn controls a circuit 13 for actuating the various servo motors of the disk unit, and a circuit 14 for precompensation of the signals to be recorded. Finally the circuit 10 can receive the signals which are read from the disk and decoded by a data separator circuit 16 which is operable automatically to select the timing mode with which the data are recorded and to couple the phase of the timing signals in such a way as to follow the minor variations in phase of the input data caused for example by casual variations in the speed of the motor for driving the magnetic disk in rotation.

Figure 2:
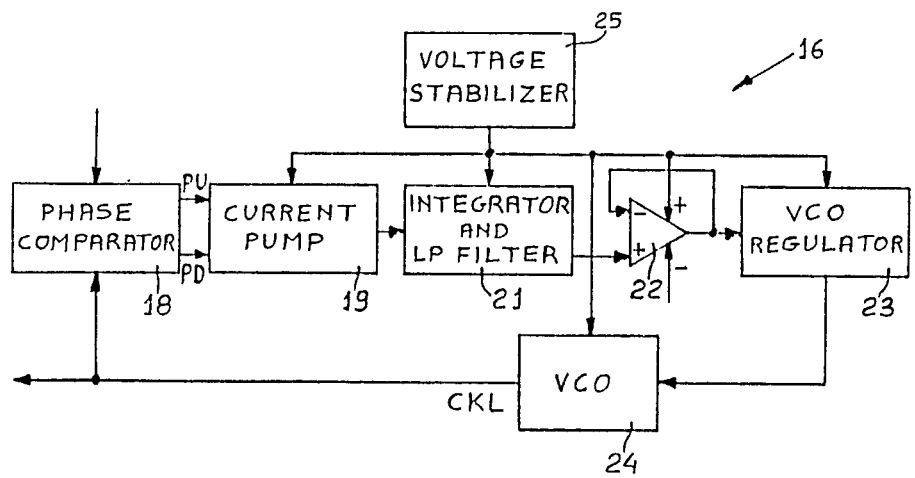
FIG. 2 is a block circuit diagram of a part of the control arrangement shown in FIG. 1.

In particular the circuit 16 comprises a phase comparator circuit 18 with feedback (see FIG. 2) which, as is known, compares the read bit with a data window provided on the central part of the synchronising pulses.

The output of the circuit 18 (PU=pump up, PD=pump down) is operable to control a signal integrator with low pass filter 21, by means of a current charging or dicharging pump 19. The output of the integrator 21 is amplified by an operational amplifier 22 and, by means of a regulating circuit 23, provides control for a voltage controlled multivibrator or oscillator (VCO) 24. The latter generates the pulses CKL for timing the reading operation for decoding the data bits. The pulses CKL are also applied as feedback to the phase comparator 18 to hold the phase of the reading signals coupled to that of the signals CKL. The oscillator 24 is capable of generating the pulses CKL selectively in accordance with the two frequencies of 2.4 MHz and 4 MHz.

Finally the data separator 16 comprises a voltage stabiliser 25 for the purposes of ensuring stability of operation for the various circuits 19, 21, 22, 23 and 24. In particular, with reference to FIG. 3, the data separator 16 is supplied by a voltage source capable of providing a voltage of +5V and voltages of +12V and −12V. The stabiliser 25 comprises an integrated circuit IC1 which may be formed by the standard integrated circuit 78L05 which is produced by various companies. The circuit IC1 is connected at its input to the +12V supply voltage and is connected at two outputs to a capacitor C5. The stabiliser 25 generates at one of those outputs an analog reference voltage AGND while at the other output it generates a voltage VREG which is of a predetermined value with respect to the voltage AGND.

The pump circuit 19 comprises a transistor T1 acting as a diode and connected in series with a resistor R1 between the voltage VREG and the common base of a mirror comprising transistors T2 and T3. The emitters of the two transistors T2 and T3 are connected in series with two corresponding resistors R2 and R3 to the voltage VREG and form a first generator for generating current in dependence on the bits A–C. The base of the transistor T1 is connected to its collector and, by means of a series of diodes D1–D4 in series with a series of resistors R6–R9, is also connected to the outputs in parallel relationship of the comparator 18. In particular the output connected to D1 and R6 provides a signal FAST which is generated when the phase comparator 18 (see FIG. 2) has produced phase coupling of the reading signals. The outputs connected to D2-R7, D3-R8, D4-R9 (see FIG. 3) respectively produce the reading bits A, B and C. The diodes D1–D4 are connected by way of a resistor R11 to the reference voltage AGND.

The collector of the transistor T2 is connected to the collector of a transistor T4 of a second generator for generating current in dependence on the bits A–C, which forms a current source, formed by a second mirror consisting of transistors T4 and T5. The common base of the two transistors T4 and T5 is also connected to the collector of the transistor T4 while the emitters of the transistors T4 and T5 are connected by way of two corresponding resistors R4 and R5 to the reference voltage AGND.

The signal integrator and low pass filter 21 comprises a first capacitor C1 in parallel with a resistor R12 and a second capacitor C2 which is connected between them and the reference voltage AGND. It performs the function of an integrator for the two signals PU and PD generated by the phase comparator 18 (FIG. 2) on two corresponding outputs. They are connected to the two current generators T2, T3 and T4, T5 (see FIG. 3) by way of an electronic switching means formed by four diodes D6–D9 included in the current pump 19. The signal at the output PU (pump up) indicates that it is necessary to charge the integrator 21 while the signal at the output PD (pump down) indicates that it is necessary to discharge the integrator 21.

In particular the collector of the transistor T3 is connected to the output PU of the comparator 18 by way of the diode D6 which in turn is connected to the voltage +5V by way of the resistor R13. In addition the collector of the transistor T3 is connected to the collector of the transistor T5 by way of the two diodes D8 and D9 while the diode D7 which is in opposite relationship to the diode D9 is connected to the output PD of the phase comparator 18.

The different combinations of the signal FAST and the bits A, B and C cause the generation of a different current at the transistors T2 and T3, which is absorbed by the transistors T4 and T5. The signals PU and PD cause charging-discharging of the two capacitors C1–C2 and thus the slight variation in the output current FOUT to follow the phase of the signal read, by way of the electronic switching means D6–D9.

The operational amplifier 22 is of the type having a high input impedance so as not to load the current integrator 21 and is capable of outputting, in dependence on FOUT, a voltage which forms the offset voltage of the voltage controlled oscillator 24. In particular the amplifier 22 essentially comprises an integrated circuit IC2 which is formed for example by the standard circuit TL081 from Texas Instruments.

The circuit IC2 is fed by the voltages +12V and −12V and receives the voltage FOUT at its positive input which is also connected to a resistive divider formed by two equal resistors R14 and R15 of one Mohm disposed between the voltage VREG and the reference voltage AGND whereby the voltage at the positive input assumes a preset value of VC.

The negative input of the circuit IC2 is connected to the output of the same circuit by way of a 750 ohms resistor R18 which in turn is connected between two equal 1.5 kohms resistors R16 and R17. Those resistors are therefore of such a size as to produce a control voltage of 2 VC at the output of the circuit IC2. A Zener diode D10 serves to protect the output of the circuit IC2 from over-voltages when starting up.

The voltage controlled oscillator 24 is formed by another integrated circuit IC3 which comprises a first section 26 capable of generating a frequency of 2.4 MHz on an output U24 and a second section 27 capable of generating a frequency of 40 MHz on an output U40.

In particular the integrated circuit IC3 may be formed for example by the voltage controlled multivibrator LS629 produced by Texas Instrument, and receives the supply voltages VREG and +5V while it is connected to the analog reference voltage AGND and to a digital reference voltage DGND.

Each section 26, 27 of the circuit IC3 is enabled by a corresponding logic enable signal E24 and E40 respectively which are active when they are low and are generated by the control circuit 10 (see FIG. 1). Each section 26, 27 is also connected to a corresponding capacitor C3 and C4 respectively, of such a size as to determine the desired frequency at the outputs U24 and U40 respectively.

Each section 26 and 27 is also fed at an input by a bias voltage produced by means of a resistive divider formed by two equal resistors R27 and R28 disposed in series between the voltage VREG and the reference voltage AGND. The two resistors R27 and R28 are of substantially equal value to that of the resistors R16 and R17.

Each section 26 and 27 is also controlled at an input I1 and I2 respectively by a displacement or offset voltage defined by a voltage adder. The adder is of the passive type with a loss of 50% whereby it is operable to produce an offset corresponding voltage substantially equal to VC. The adder of the section 26 is formed by a first resistor R25 connected between the input I1 of the section 26 and the output of the operational amplifier IC2, and a second resistor R26 connected between the same input I1 of the section 26 and a resistive divider formed by two equal resistors R21 and R22 disposed between the voltage VREG and the reference voltage AGND.

Similarly, the voltage adder of the section 27 is formed by a resistor R24 disposed between the input I2 of the section 27 and the output of the amplifier IC2, and a resistor R23 connected between the input I2 of the section 27 and a resistive divider formed by two other resistors R19 and R20 connected between the voltage VREG and the reference voltage AGND. The resistors R24 and R23 are also of a value substantially equal to that of the resistors R25 and R26 respectively.

In each adder, the resistance of a branch of the adder is substantially to balance the resistance of the other branch of the adder in such a way as to provide an impedance for the system which is very low as seen by the circuit IC3. In particular, for the section 26, besides the 50% drop in voltage, the following conditions should also obtain:

R25=R26+R21//R22 and
R25//R26+R19//R22<<50 kohms.

Similarly, for the section 27, the following conditions should obtain:

R24=R23+R19//R20 and R24//R23
+R19//R20<<50 kohms.

Those conditions cause the resistors R23 and R26 to be selected of a value of between 2 and 10 kohms, from which the theoretical values of R19, R20, R21 and R22 can be obtained. In particular, a value of 3300 ohms was selected for R23 and R26 whereby the value of each pair R19//R20 and R21//R22 is 750 ohms.

Since the output frequencies of the circuit IC3 depend on the offset voltages, they must be very accurate. They may be calibrated by varying the resistors of each adder. In practice it is sufficient to calibrate only the voltage supplied by the associated divider for voltages R21-R22 and R19-R20 respectively.

Calibration of the regulating circuit is generally effected at the time of manufacture of the circuit, taking account of the fact that an increase in the resistors R20 and R21 causes a reduction in the associated frequency while an increase in the resistors R19 and R22 causes an increase in the associated frequency.

It will be apparent that a variation in a resistor can be produced much more easily than a variation in a capacitor; the variation in the resistors can be produced by means of an increase in the associated value, starting from a minimum value. Since the sections 26 and 27 of the integrated circuit IC3 have a tolerance of 30%, the voltage dividers R19//R20 and R21//R22 respectively must generate a voltage of 2.5V+0.6V. The value of each resistor R19-R22 must therefore be between 1 and 3 kohms whereby they can be calibrated by starting from a minimum value of 1 kohm.

The regulating circuit described lends itself very well to mass production in the form of a hybrid integrated circuit. In that way it is possible to dispose the control arrangement for the magnetic disk unit of a personal computer on the base board of the central unit.

Figure 3:
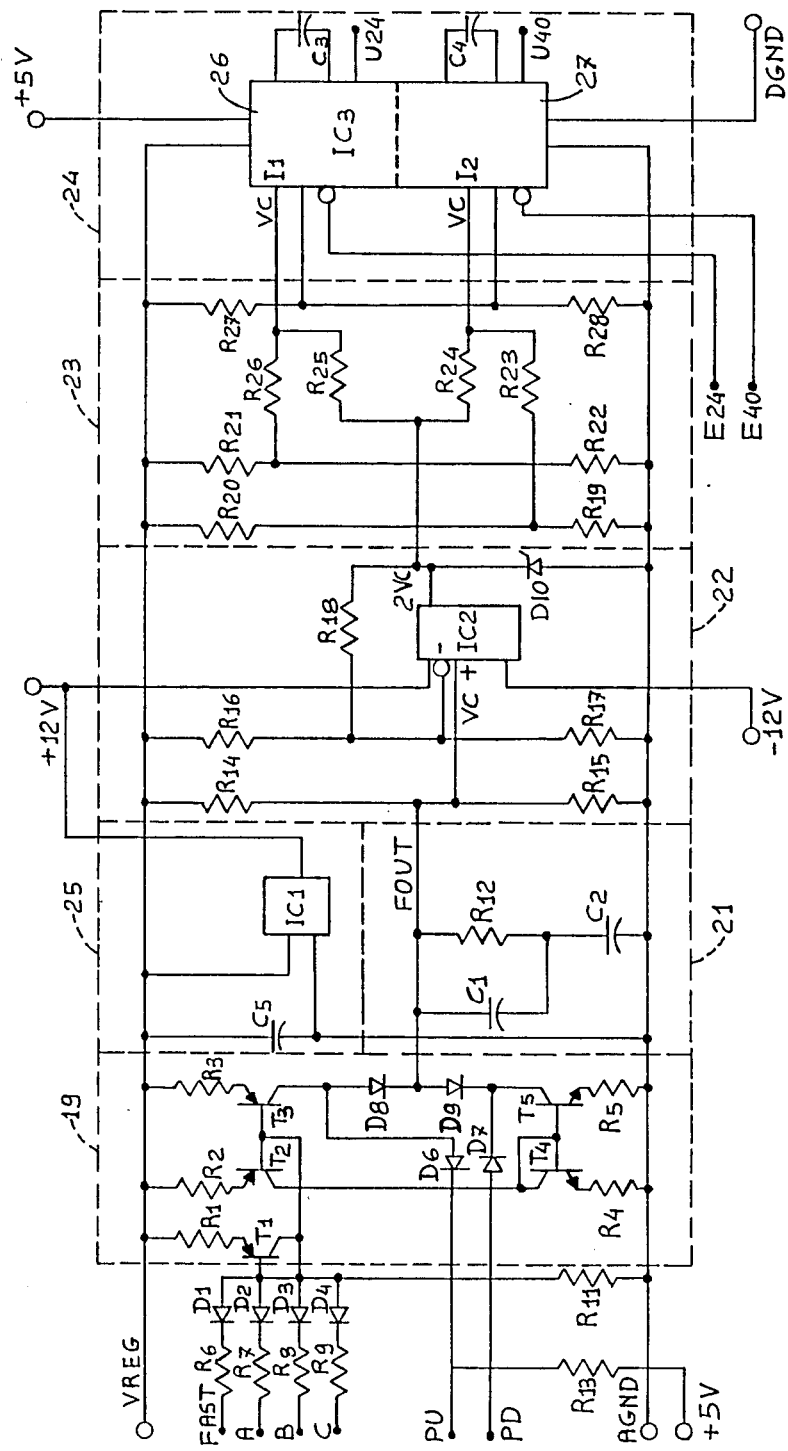
FIG. 3 is a detailed electrical diagram of some blocks of the arrangement shown in FIG. 2.
Figure 4:
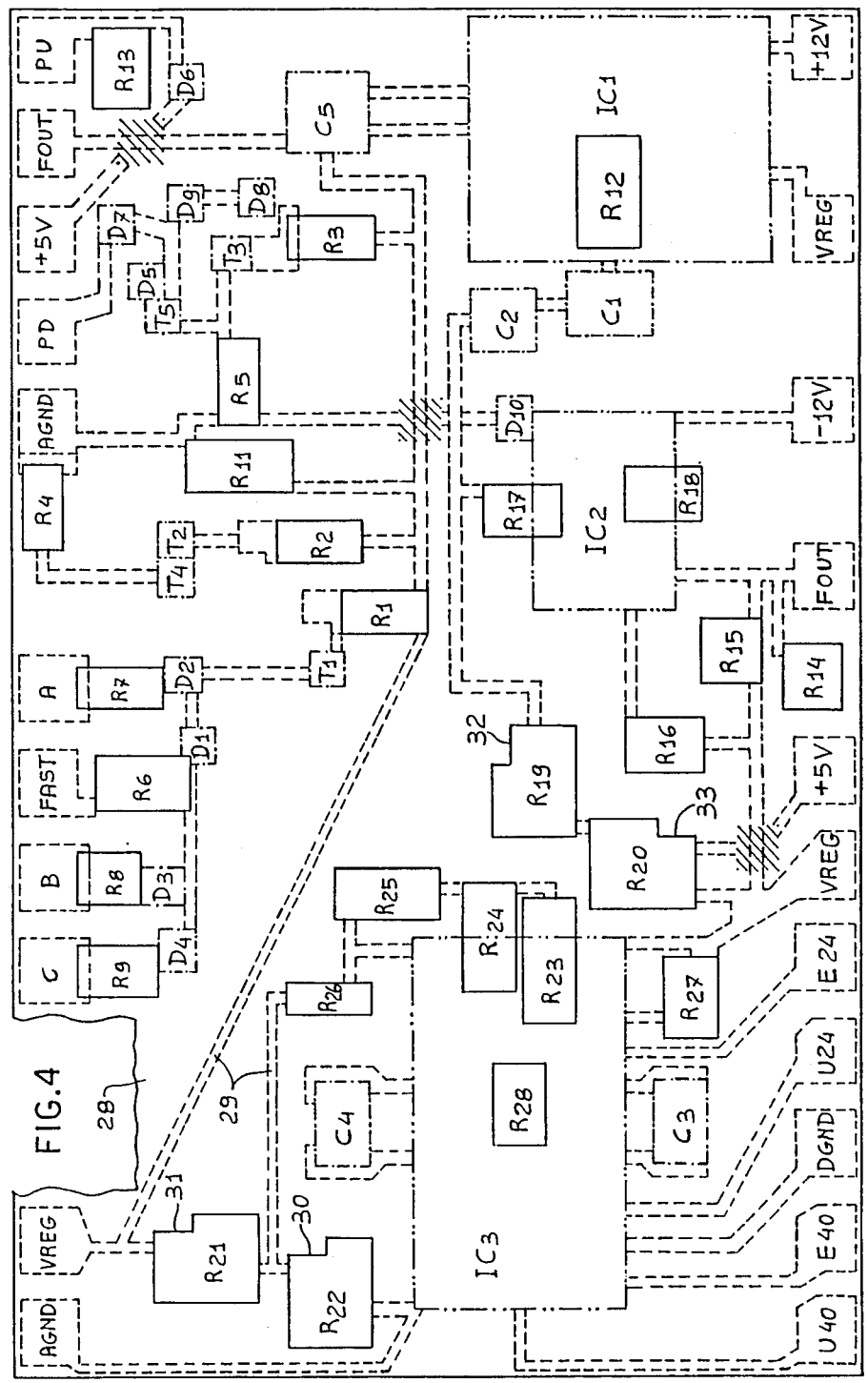
FIG. 4 is a view on an enlarged scale of a hybrid integrated circuit which provides the electrical diagram in FIG. 3.

FIG. 4 shows on a greatly enlarged scale an embodiment of such a hybrid circuit, the components of which are denoted by the same references as in FIG. 3. The hybrid circuit is produced by starting from an alumina plate 28 of a thickness of between 0.6 and 0.8 mm and of rectangular shape, measuring for example 28×40 mm.

The procedure comprises first applying to the plate, using a thick-film screen printing process, a pattern of conductors 29 which is shown in part in FIG. 4 and which is indicated therein by broken lines, and a pattern of resistors R1-R22, as shown by solid lines. At the locations at which conductors and resistors are in superposed relationship, the layers are caused to pass over each other in known fashion by means of the deposit of an insulating layer as indicated in FIG. 4 by a hatching square.

The conductors 29 comprise a series of aligned terminal areas on the two major sides of the plate 28 as indicated in FIG. 4 by the names of the respective signals. The areas indicated by the same signal name are connected together by conductors which are disposed on the opposite face of the plate 28 but which are not shown in FIG. 4.

After the conductors 29 and the resistors have been produced on the plate 28, the discrete components formed by the capacitors C1-C5, the diodes D1-D10 and the transistors T1-T5 which are shown in dash-dotted lines in FIG. 4 are mounted on and soldered to the plate. The three integrated circuits IC1, IC2 and IC3 shown in FIG. 4 in dashed and double-dotted lines are then fixed and soldered in position. Finally, the respective lead portions (not shown in FIG. 4) are mounted on and soldered to the areas of the two edges of the plate 28.

An operation is now effected for static calibration of the individual resistors of predetermined values, with trimming of the surface of the associated layer by means of a suitable instrument (trimmer). Functional calibration of the circuit is then carried out with a test apparatus which makes it possible to detect the currents applied to the individual lead portions and the frequencies produced at the outputs U24 and U40. Calibration of the section 26 of the circuit IC3 is effected by acting by means of the trimmer on an edge 30 of the resistor R22 if the frequency of the output U24 is to be increased and an edge 31 of the resistor R21 if that frequency is to be reduced. Similarly, calibration of the section 27 of the circuit IC3 is effected by acting by means of the trimmer on an edge 32 of the resistor R19 to increase the frequency at the output U40 and the edge 33 of the resistor R20 to reduce that frequency.

After the calibration operation, the plate 28 and the components fixed thereon is encased in a polymer resin and the circuit is enclosed in a casing from which the lead portions project.

It will be appreciated that the circuit described may be the subject of various modifications and improvements without departing from the scope of the invention. For example the voltage controlled oscillator circuit may be applied to other types of control arrangements for electronic apparatuses requiring a clearly defined operational frequency. In addition the associated integrated circuit may be produced with different patterns and with active components different from those indicated herein.

We claim:

1. In a control arrangement for controlling a unit for reading and writing data on a magnetic carrier, including a voltage controlled oscillator, a circuit for regulating said voltage controlled oscillator, wherein the oscillator is supplied at one of its inputs with a bias voltage and at another one of its inputs with a phase displacement voltage, a preset voltage source, a voltage adder for defining said phase displacement voltage, a resistive divider connected to said voltage source for supplying to said adder a first voltage component of said phase displacement voltage, and means for generating another component of said phase displacement voltage, at least one resistor of said resistive divider being calibratable in such a way as to define with a high precision said first voltage component for said adder.

2. A circuit according to claim 1, characterised in that the bias voltage for the oscillator is produced by said preset voltage source (VREG) by way of another resistive divider (R27, R28).

3. A circuit according to claim 1 or 2, characterised in that said other voltage component generated by an operational amplifier (22) from a control signal (FOUT).

4. In a control arrangement for controllng a unit for reading and writing data on a magnetic carrier selectively according to at least a pair of predetermined frequencies, including a voltage controlled oscillator formed of at least a pair of sections capable of generating said pair of different frequencies, a circuit for regulating said sections of said voltage controlled oscillator, wherein each section is supplied at one of its inputs with a bias voltage and at another one of its inputs with a corresponding phase displacement voltage, a common preset voltage source, at least a pair of voltage adders associated with said pair of sections for defining each one of the corresponding phase displacement voltage, at least a pair of resistive dividers connected to said common voltage source and associated with said pair of adders for supplying each one to the associated adder a first voltage component of said corresponding phase displacement voltage, and means for generating another component of each of said corresponding phase displacement voltages, at least one resistor of each one of said resistive dividers being calibratable in such a way as to define with high precision the corresponding first voltage component for the corresponding adder.

5. A circuit according to claim 4, characterised in that each adder (R25, R26; R24, R23) has a voltage drop of the order of 50% and comprises a junction at which the resistors of the corresponding resistive dividers (R21, R22; R20, R19) are balanced.

6. A circuit according to claim 5, characterised in that the impedance of each adder (R25, R26; R24, R23) and the corresponding resistive divider (R21, R22; R20, R19) in relation each section of the oscillator (24) is much less than 50 kohms.

7. A circuit according to claim 6, characterised in that the voltage generated by the amplifier (22) is applied to each adder (R25, R26; R24, R23,) by way of a resistance (25; 24) of between 2 and 10 kohms, the corresponding resistive divider being formed by two calibratable resistors of between 1 and 3 kohms (R21, R22; R20, R19).

8. A circuit according to claim 7, characterised in that regulation of each frequency is effected by selectively calibrating the resistors of the corresponding resistive divider (R21, R22; R20, R19).

9. A circuit according to claim 4, characterised in that the bias voltage for each section of the oscillator is produced by said common voltage source (VREG) by way of another resistive divider associated with each section.

10. A circuit according to claim 4 or 9, characterized in that said other voltage component is generated by an operational amplifier from a control signal (FOUT) by way of a corresponding resistance.

11. A hybrid integrated circuit for controlling a unit for reading and writing data on a magnetic carrier, said hybrid circuit including a voltage controlled oscillator, a circuit for regulating said voltage controlled oscillator, wherein the oscillator is supplied at one of its inputs with a bias voltage and at another one of its inputs with a phase displacement voltage, a voltage adder for defining said phase displacement voltage, a resistive divider connected to a preset voltage source for supplying to said adder a first voltage component of said phase displacement voltage, and means for generating another component of said phase displacement voltage, at least one resistor of said resistive divider being produced by the deposit of a thick-film resistive layer, said at least one resistor being calibratable by means of the removal of part of the associated deposited resistive layer in such a way as to define with a high precision said first voltage component for said adder.

12. A circuit according to claim 11, characterised in that the hybrid integrated circuit is formed on a single board together with a voltage-controlled multivibrator (26), the operational amplifier (22) and a current pump (19).

* * * * *